(12) United States Patent
Mende et al.

(10) Patent No.: US 9,625,495 B2
(45) Date of Patent: Apr. 18, 2017

(54) ISOLATED PROBE WITH DIGITAL MULTIMETER OR DIGITAL VOLTMETER

(71) Applicant: Tektronix, Inc., Beaverton, OR (US)

(72) Inventors: Michael J. Mende, Portland, OR (US); Richard A. Booman, Lake Oswego, OR (US)

(73) Assignee: TEKTRONIX, INC., Beaverton, OR (US)

( * ) Notice: Subject to any disclaimer, the term of this patent is extended or adjusted under 35 U.S.C. 154(b) by 158 days.

(21) Appl. No.: 14/061,327

(22) Filed: Oct. 23, 2013

(65) Prior Publication Data

US 2015/0054492 A1    Feb. 26, 2015

Related U.S. Application Data

(60) Provisional application No. 61/868,968, filed on Aug. 22, 2013.

(51) Int. Cl.
| | |
|---|---|
| *G01R 15/12* | (2006.01) |
| *G01R 1/067* | (2006.01) |
| *G01R 19/25* | (2006.01) |
| *G01R 13/02* | (2006.01) |

(52) U.S. Cl.
CPC ....... *G01R 15/125* (2013.01); *G01R 1/06788* (2013.01); *G01R 19/2503* (2013.01); *G01R 13/0272* (2013.01)

(58) Field of Classification Search
CPC .............. G01R 15/125; G01R 1/06788; G01R 13/0272; G01R 15/12; G01R 31/36; G01R 13/02; G01R 13/405; G01R 15/00
See application file for complete search history.

(56) References Cited

U.S. PATENT DOCUMENTS

| | | |
|---|---|---|
| 4,034,291 A | 7/1977 | Allen et al. |
| 4,758,779 A | 7/1988 | Thong |
| 5,034,698 A | 7/1991 | Moriyasu |
| 5,225,776 A | 7/1993 | Dobos et al. |
| 5,396,168 A * | 3/1995 | Heep et al. ............... 324/115 |
| 8,497,696 B2 | 7/2013 | Reichel |
| 2004/0093342 A1* | 5/2004 | Arbo et al. ............... 707/102 |

(Continued)

FOREIGN PATENT DOCUMENTS

WO    2004049897 A2    6/2004

OTHER PUBLICATIONS

Extended European Search Report for European Application No. 14181935.9, dated Feb. 2, 2015, 6 pages, Munich.

*Primary Examiner* — Son Le

(74) *Attorney, Agent, or Firm* — Marger Johnson

(57) ABSTRACT

The disclosed technology relates to a probe for use with a test and measurement instrument. The probe includes a digital multimeter or voltmeter with an analog-to-digital converter configured to measure a signal from a device under test and determine a digital measurement from the signal, a controller connected to the multimeter or voltmeter configured to receive the digital measurement from the multimeter or voltmeter, a digital communication interface connected to the controller configured to communicate with the controller, and a communication link connected to the digital communication interface and the analog signal interface to communicate with the test and measurement instrument.

10 Claims, 3 Drawing Sheets

(56) References Cited

U.S. PATENT DOCUMENTS

2007/0069716 A1  3/2007  Sleeman et al.
2008/0042666 A1  2/2008  Sullivan
2010/0277190 A1  11/2010 Reichel et al.
2012/0046897 A1  2/2012  Panko

* cited by examiner

ISOLATED PROBE WITH DIGITAL MULTIMETER OR DIGITAL VOLTMETER

CROSS-REFERENCE TO RELATED APPLICATIONS

This application claims priority from U.S. Provisional Patent Application No. 61/868,968, filed Aug. 22, 2013, entitled "ISOLATED PROBE WITH DIGITAL MULTIMETER OR DIGITAL VOLTMETER," the disclosure of which is incorporated herein by reference in its entirety for all purposes.

TECHNICAL FIELD

The disclosed technology relates to a probe or an accessory head for an instrument, preferably a test and measurement instrument, such as an oscilloscope, that includes a digital multimeter or a digital voltmeter that provides a reading that is galvanically isolated from earth ground.

BACKGROUND

Digital multimeters (DMM) and digital voltmeters (DMV) are commonly used in conjunction with test and measurement instruments, probes, and accessories. The test and measurement instrument may be an oscilloscope, for example. An oscilloscope provides a visual picture in time of how a circuit is performing. Traditionally, with oscilloscopes, the accuracy and resolution of a voltage measurement is limited and is typically a ground referenced measurement. DMMs and DVMs, on the other hand, can provide extremely accurate, high resolution measurements that are galvanically isolated, also known as "floating," from earth ground.

Past attempts have been made to incorporate DMM and DMV measurements into oscilloscopes to obtain an accurate voltage measurement. These attempts, however, have been limited by requiring an additional set of probes to be connected to the device under test or integrating the DVM feature into the oscilloscope itself that is ground referenced and is limited in sensitivity and accuracy by the traditional oscilloscope probe connected to the oscilloscope.

Combining DMM-like and DMV-like measurement capabilities with a traditional oscilloscope voltage probe that is galvanically isolated from earth ground would overcome the limitations of the past and provide an easy to use solution. This would be particularly useful for users making non-ground referenced, or "floating," voltage measurements.

SUMMARY

Certain embodiments of the disclosed technology include a probe for use with a test and measurement instrument. The probe includes a digital multimeter or voltmeter with an analog-to-digital converter configured to measure a signal from a device under test and determine a digital measurement from the signal, a controller connected to the multimeter or voltmeter configured to receive the digital measurement from the multimeter or voltmeter, a digital communication interface connected to the controller configured to communicate with the controller, and a communication link connected to the digital communication interface and the analog signal interface to communicate with the test and measurement instrument.

Certain other embodiments of the disclosed technology include a test and measurement system. The system includes a probe having a digital multimeter or voltmeter with an analog-to-digital converter configured to measure a signal from the device under test and determine a digital measurement from the signal, a controller connected to the multimeter or voltmeter configured to receive the digital measurement from the multimeter or voltmeter, a digital communication interface connected to the controller configured to communicate with the controller, and a communication link connected to the digital communication interface and the analog signal interface. The system also includes a second controller connected to the communication link and an oscilloscope connected to the probe through the second controller and the communication link.

Certain other embodiments include a method of using a probe with an oscilloscope. The method includes measuring a signal from a device under test at the probe, determining a digital measurement from the signal with a digital multimeter or voltmeter with an analog-to-digital converter located within the probe, receiving the digital measurement by a first controller within the probe, communicating the digital measurement from the first controller to a digital communication interface within the probe, and communicating the digital measurement from the digital communication interface to a second controller through a communication link.

The foregoing and other objects, features and advantages of the invention will become more readily apparent from the following detailed description of embodiments of the invention which proceeds with reference to the accompanying drawings.

DETAILED DESCRIPTION

Figure 1:
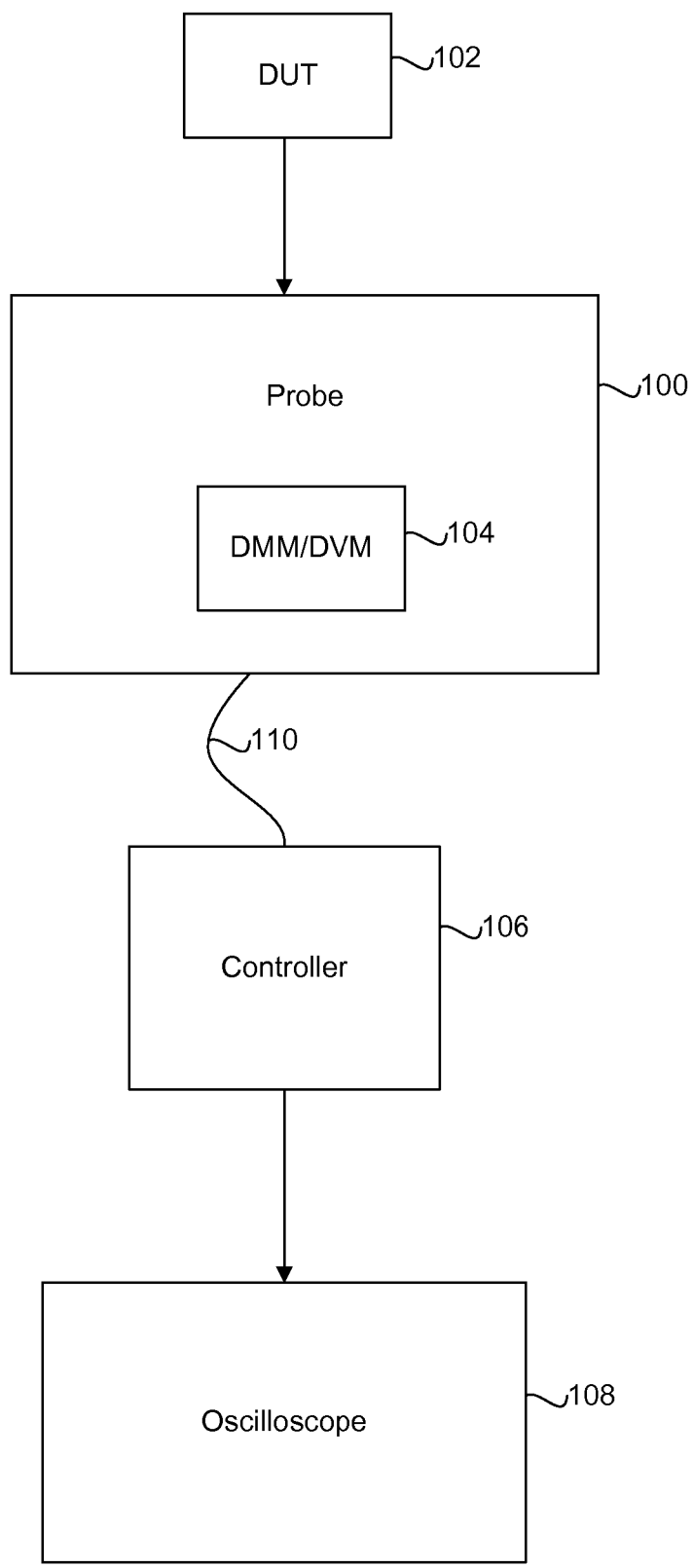
FIG. 1 illustrates a high-level view of a test and measurement system.

In the drawings, which are not necessarily to scale, like or corresponding elements of the disclosed systems and methods are denoted by the same reference numerals.

FIG. 1 shows a high level view of a test and measurement system using a probe 100 with a DMM or DMV 104 within the probe 100. Initially, a signal is received from a device under test (DUT) 102 by the probe 100 and measured by DMM or DMV 104. The measurement from the DMM or DMV 104 is then sent to a controller 106, through a communication link 110, which will be discussed in further detail below. Finally, the controller 106 is connected to the oscilloscope 108 to display the measurement on a display (not shown) of the oscilloscope 108. Either a high accuracy digital measurement can be displayed on the oscilloscope or a traditional analog measurement, using a single probe. Alternately, the high accuracy measurement can be used to actively compensate the displayed analog measurement. The probe 100 may be either probe 200 or probe 300, discussed in further detail below.

Figure 2:
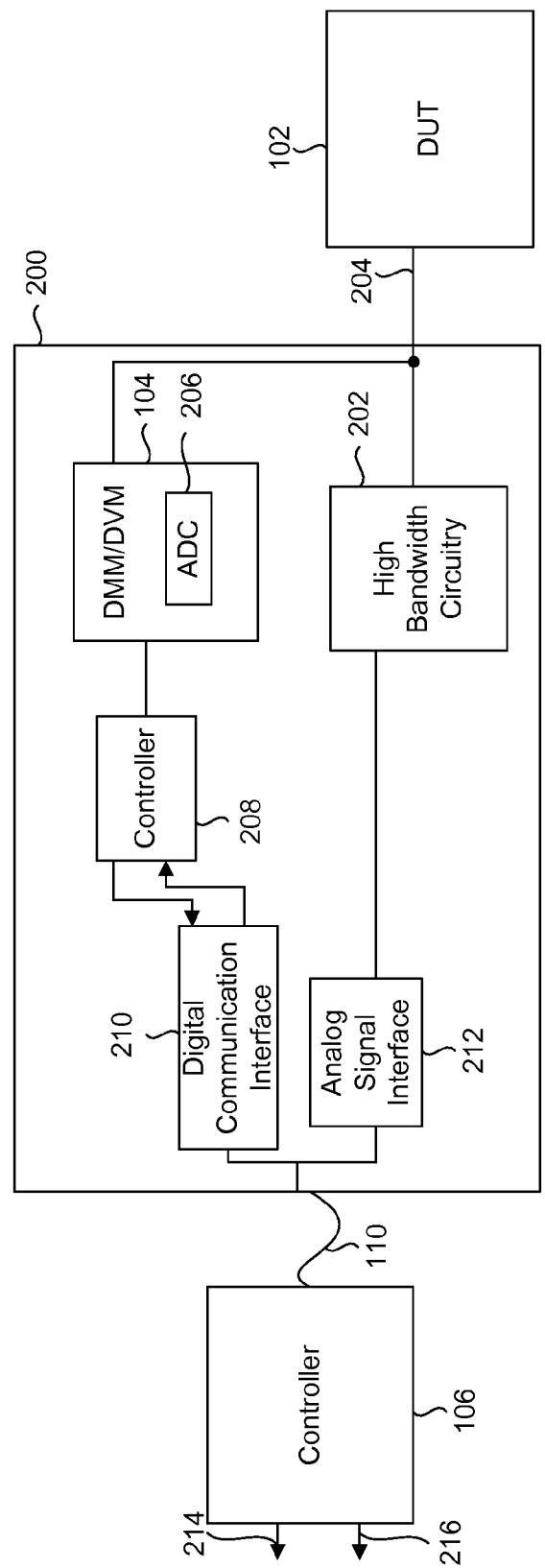
FIG. 2 illustrates a probe according to certain embodiments of the disclosed technology.

FIG. 2 shows the components of a probe 200, which is ultimately connected to a test and measurement instrument, such as oscilloscope 108, according to some embodiments of the invention. As shown in FIG. 2, the probe 200 includes two paths. The first path, through the DMM or DMV 104 is a high accuracy, low speed digital path. The second path, through high bandwidth circuitry 202, is a high bandwidth path, which provides the traditional oscilloscope measurements.

When a signal 204 is received at the probe 200, the signal is sensed by both the DMM or DMV 104 of the high accuracy digital path and the high bandwidth circuitry 202 of the high bandwidth path. Each path will be discussed in further detail below.

Starting with the high accuracy path, the signal 204 is received and processed by the DMM or DMV 104. The DMM or DMV 104 consists of appropriate signal conditioning circuitry (not shown) followed by an analog-to-digital (ADC) converter 206. The signal 204 goes through the signal conditioning circuitry before being converted to a digital signal via ADC 206. The digitized measurement is then sent to controller 208.

Controller 208 communicates with the ADC 206 as well as with a digital communication interface 210. The digital communication interface 210 provides the interface between the controller 208 and controller 106 through the communication link 110. ADC 206 sends the digitized measurement to the controller 208. Then controller 208 sends the digitized measurement to the digital communication interface 210.

Turning now to the high bandwidth path, the signal 204 of the DUT 102 goes to high bandwidth circuitry 202. The output of the high bandwidth circuitry 202 is sent to an analog signal interface 212, which is connected to the controller 106 through the communication link 110.

Controller 106 is connected to the oscilloscope, and the digital measurement from the high accuracy digital path or the analog signal from the high bandwidth path is output to the display of the oscilloscope. The oscilloscope 108, as will be readily understood by one skilled in the art, contains input buttons (not shown) to allow a user to indicated desired parameters for the digital or analog measurements that are displayed.

Controller 106 either sends an output 214 with the digital measurement to the oscilloscope 108 and/or an output 216 with the analog measurement to the oscilloscope 108. The controller 106 can also scale and condition the output signal from the ranges and parameters inputted by the user at the oscilloscope.

Probes 100-300 allow a user to use a single probe with a DUT 102 to receive digitized high accuracy measurements through the high accuracy digital path or analog measurements through the high bandwidth path. Due to the DMM or DMV 104 being placed in the probe, and controlled directly via controller 208 and indirectly via controller 106, the DMM or DMV 104 function of the probe is galvanically isolated from the oscilloscope and earth ground.

Figure 3:
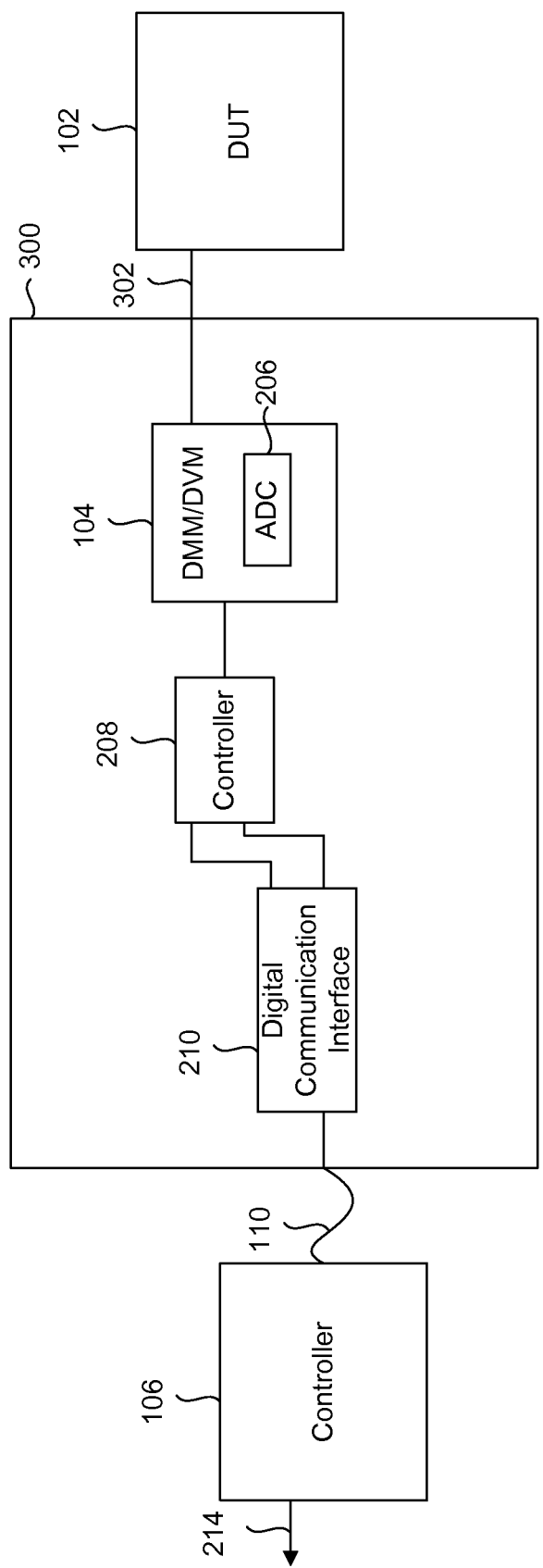
FIG. 3 illustrates a probe according to other embodiments of the disclosed technology.

The communication link 110 can be a conductor or, preferably, an optical fiber. The communication link 110 may also be a wireless or radio frequency (RF) communication link. An optical fiber communication link provides complete galvanic isolation to the test and measurement equipment it is connected to and ultimately from earth ground. Further, increasing the length of the optical fiber communication link 110 will allow the probe 200 to be connected to higher common-mode voltages with respect to earth ground In other embodiments, a probe 300 may include only a high accuracy, digital path, which is galvanically isolated from controller 106 and earth ground, as shown in FIG. 3. For example, in FIG. 3, when a signal 302 is measured from DUT 102, the signal 302 is sensed by DMM or DMV 104. The DMM or DMV 104 has the same functions as those discussed above with respect to FIG. 2. For example, when the signal 302 is sensed by DMM or DMV 104, the signal 302 is processed by DMM or DMV 104 and ADC 206 to generate a digitized measurement. The digitized measurement is sent to the controller 208, which communicates with the digital communication interface 210.

As in the embodiment shown in FIG. 2, the digital communication interface 210 has two-way communication with the controller 208, and provides all the same functions as those discussed above with respect to the embodiment shown in FIG. 2. Digital communication interface 210 is also connected to a communication link 110 and a controller 106. The output from controller 106 is sent to a test and measurement instrument, such as an oscilloscope, as discussed above with respect to FIG. 2.

As will be readily understood by one skilled in the art, the probes 100-300 can be any type of probe, sensor, or transducer. Although the probes discussed above are shown as a standalone devices, the probes 100-300 can be built into other devices The probes of the disclosed technology allow for complete galvanic isolation between the probe and the test equipment, such as an oscilloscope, connected to the probe. When a fiber optic communication link is used for an isolation barrier, the bridging coupling across this barrier is very small which enables high common-mode rejection from direct current (DC) to very high bandwidths to be achieved. This allows the user to make non-ground referenced measurements and eliminates the potential for circulating currents to develop forming "ground-loops" which degrade the accuracy and signal fidelity of the measurement. The probes of the disclosed technology are capable of measuring signals on top of large common-mode voltages.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A probe for use with a test and measurement instrument, comprising:
   a digital multimeter or voltmeter with an analog-to-digital converter configured to receive a signal from a device under test and determine a digital measurement from the signal;
   a first controller connected to the multimeter or voltmeter configured to receive the digital measurement from the multimeter or voltmeter;
   a digital communication interface connected to the first controller configured to communicate with the first controller;
   a communication link connected to the digital communication interface to communicate with the test and measurement instrument;
   analog measurement circuitry connected to the device under test configured to receive a signal from a device under test and process the signal from the device under test;
   an analog signal interface connected to the analog measurement circuitry and the communication link; and
   a second controller connected to the communication link for connecting the probe to the test and measurement instrument;
   wherein the second controller communicates with the digital communication interface to receive the digital measurement and the analog signal interface to receive an analog signal from the analog measurement circuitry.

2. The probe of claim 1, wherein the communication link is an optical fiber, a conductor, a wireless communication link or a radio frequency communication link.

3. The probe of claim 2, wherein the communication link is the optical fiber.

4. The probe of claim 1, wherein the controller and the communication link have two-way communication.

5. The probe of claim 1, wherein the probe is a sensor or transducer.

6. A test and measurement system, comprising:
a probe, including:
  a digital multimeter or voltmeter with an analog-to-digital converter configured to receive signal from a device under test and determine a digital measurement from the signal;
  a first controller connected to the multimeter or voltmeter configured to receive the digital measurement from the multimeter or voltmeter;
  a digital communication interface connected to the controller configured to communicate with the first controller;
  analog measurement circuitry connected to the device under test configured to receive a signal from a device under test and process the signal from the device under test;
  an analog signal interface connected to the analog measurement circuitry and the communication link;
  a communication link connected to the digital communication interface and the analog signal interface;
a second controller connected to the communication link; and
an oscilloscope connected to the probe through the second controller and the communication link;
wherein the second controller communicates with the digital communication interface to receive the digital measurement and the analog signal interface to receive an analog signal from the analog measurement circuitry.

7. The test and measurement system of claim 6, wherein the communication link is an optical fiber, a conductor, a wireless communication link or a radio frequency communication link.

8. The test and measurement system of claim 7, wherein the communication link is the optical fiber.

9. A method of using a probe with a test and measurement instrument, comprising:
measuring a signal from a device under test at the probe;
determining a digital measurement from the signal with a digital multimeter or voltmeter with an analog-to-digital converter located within the probe;
receiving the digital measurement by a first controller within the probe;
communicating the digital measurement from the first controller to a digital communication interface within the probe;
communicating the digital measurement from the digital communication interface to a second controller through a communication link;
measuring the signal from a device under test and processing the signal from the device under test by analog measurement circuit within the probe;
receiving the processed output at an analog signal interface within the probe;
sending the digital measurement or the processed output to the test and measurement instrument through the communication link and the second controller; and
displaying the digital measurement or the processed output on a display of the test and measurement instrument;
wherein the second controller communicates with the digital communication interface to receive the digital measurement and the analog signal interface to receive an analog signal from the analog measurement circuitry.

10. The method of claim 9, wherein the communication link is an optical fiber, a conductor, a wireless communication link or a radio frequency communication link.

* * * * *

UNITED STATES PATENT AND TRADEMARK OFFICE
CERTIFICATE OF CORRECTION

PATENT NO. : 9,625,495 B2  
APPLICATION NO. : 14/061327  
DATED : April 18, 2017  
INVENTOR(S) : Michael J. Mende and Richard A. Booman It is certified that error appears in the above-identified patent and that said Letters Patent is hereby corrected as shown below:

In the Claims

In Column 6 Line 23, replace "measurement circuit" with "measurement circuitry"

Signed and Sealed this  
Sixth Day of June, 2017

Michelle K. Lee  
*Director of the United States Patent and Trademark Office*